US009209195B2

(12) United States Patent
Seshadri et al.

(10) Patent No.: US 9,209,195 B2
(45) Date of Patent: Dec. 8, 2015

(54) SRAM WELL-TIE WITH AN UNINTERRUPTED GRATED FIRST POLY AND FIRST CONTACT PATTERNS IN A BIT CELL ARRAY

(71) Applicant: Texas Instruments Incorporated, Dallas, TX (US)

(72) Inventors: Anand Seshadri, Richardson, TX (US); Steve Prins, Fairview, TX (US); Russell McMullan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/874,806

(22) Filed: May 1, 2013

(65) Prior Publication Data

US 2014/0327082 A1    Nov. 6, 2014

(51) Int. Cl.
*H01L 21/70* (2006.01)
*H01L 27/11* (2006.01)
*H01L 27/02* (2006.01)

(52) U.S. Cl.
CPC ........ *H01L 27/1104* (2013.01); *H01L 27/0207* (2013.01); *H01L 27/11* (2013.01); *H01L 2924/1437* (2013.01)

(58) Field of Classification Search
CPC .................. H01L 27/1104; H01L 2024/1437; H01L 27/1052; H01L 27/11; H01L 21/8239; H01L 27/11507; H01L 2924/1434
USPC ........... 257/390, E27.098, E27.102, E21.613, 257/E21.645, E21.661; 438/128, 129, 130; 427/52
See application file for complete search history.

(56) References Cited

U.S. PATENT DOCUMENTS

| 6,521,934 | B2 * | 2/2003 | Yasuda .......................... 257/296 |
| 6,768,182 | B2 * | 7/2004 | Oyamatsu ..................... 257/506 |
| 2005/0105323 | A1 * | 5/2005 | Mellinger et al. ............. 365/154 |
| 2007/0004147 | A1 * | 1/2007 | Toubou et al. ................. 438/261 |
| 2010/0193877 | A1 * | 8/2010 | Liaw .............................. 257/390 |
| 2012/0107729 | A1 * | 5/2012 | Blatchford et al. ............... 430/5 |
| 2012/0120703 | A1 * | 5/2012 | Chang et al. .................... 365/51 |
| 2013/0157437 | A1 * | 6/2013 | Yanai et al. .................... 438/424 |

* cited by examiner

*Primary Examiner* — Galina Yushina
(74) *Attorney, Agent, or Firm* — Jacqueline J. Garner; Frank D. Cimino

(57) ABSTRACT

An integrated circuit containing an SRAM may be formed using one or more periodic photolithographic patterns for elements of the integrated circuit such as gates and contacts, which have alternating line and space configurations in SRAM cells. Strap rows of the SRAM containing well ties and/or substrate taps which have SRAM cells on two opposite sides are configured so that the alternating line and space configurations are continuous across the regions containing the well ties and substrate taps.

10 Claims, 14 Drawing Sheets

US 9,209,195 B2

SRAM WELL-TIE WITH AN UNINTERRUPTED GRATED FIRST POLY AND FIRST CONTACT PATTERNS IN A BIT CELL ARRAY

FIELD OF THE INVENTION

This invention relates to the field of integrated circuits. More particularly, this invention relates to static random access memories (SRAMs) in integrated circuits.

BACKGROUND OF THE INVENTION

SRAMs include well ties and substrate taps which provide local bias to a well or substrate region for surrounding SRAM cells. SRAM regions containing well ties and substrate taps may disrupt periodic photolithographic patterns for gates and contacts which have alternating line and space configurations in the adjacent SRAM cells.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an SRAM may be formed using one or more periodic photolithographic patterns for elements of the integrated circuit such as gates and contacts, which have alternating line and space configurations in SRAM cells. Regions of the SRAM containing well ties and substrate taps which have SRAM cells on two opposite sides are configured so that the alternating line and space configurations are continuous across the regions containing the well ties and substrate taps.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an SRAM may be formed using periodic photolithographic patterns for elements of the integrated circuit such as gates and contacts, which have alternating line and space configurations in SRAM cells. Regions of the SRAM containing well ties and substrate taps which have SRAM cells on two opposite sides are configured so that the alternating line and space configurations are continuous across the regions containing the well ties and substrate taps. The periodic photolithographic patterns may be printed using off-axis illumination sources, so that the continuous alternating line and space configurations advantageously reduce fabrication complexity and increase process latitudes for the integrated circuit.

Figure 1:
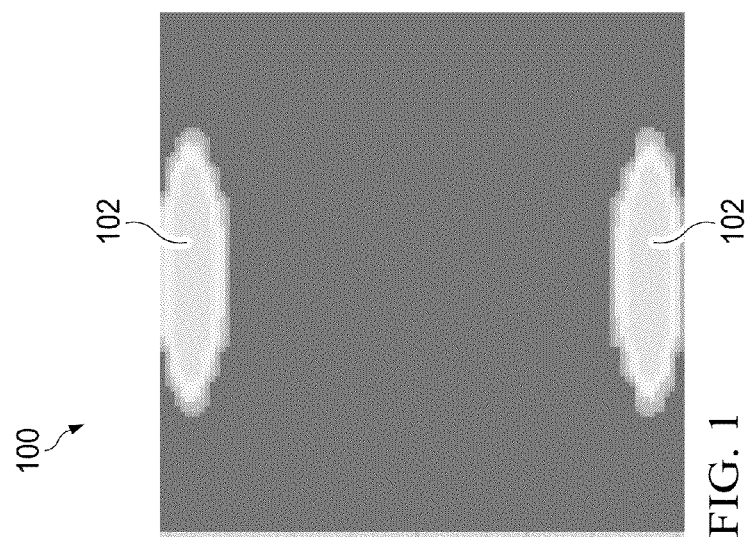
FIG. 1 depicts an exemplary illumination source having a significant off-axis component for photolithographic processes which may be used to form integrated circuits as described herein.

FIG. 1 depicts an exemplary illumination source having a significant off-axis component for photolithographic processes which may be used to form integrated circuits as described herein. The illumination source 100 is configured with two off axis regions 102, so that the illumination source 100 has a significant off-axis component. The illumination source 100 may provide, for example, 193 nanometer radiation, and may be used in an immersion photolithography tool which can resolve parallel equally spaced lines aligned with the off-axis component of the illumination source 100 having a line/space pitch length of 80 to 90 nanometers. The term "pitch length" is the sum of the line width and space width of a pattern of alternating lines and spaces.

Figure 2:
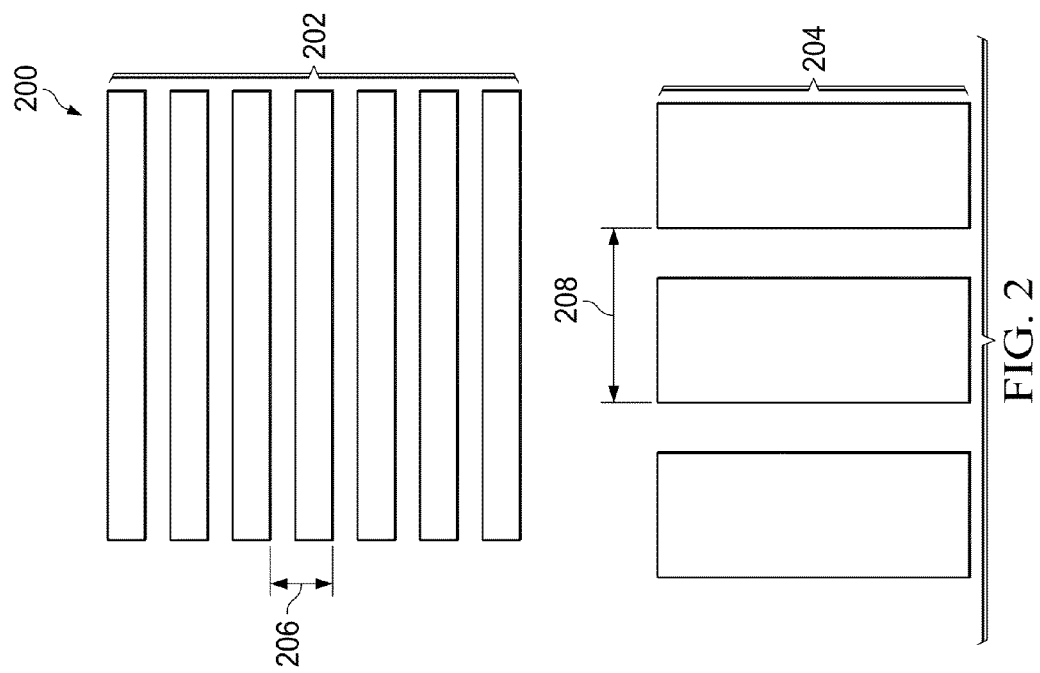
FIG. 2 depicts an exemplary pattern formed by an illumination source with a significant off-axis component, such as the illumination source depicted in FIG. 1.

FIG. 2 depicts an exemplary pattern formed by an illumination source with a significant off-axis component, such as illumination source 100, oriented as depicted in FIG. 1. The pattern 200 includes a first plurality of minimum pitch equally spaced parallel lines 202 oriented with the significant off-axis component of the illumination source 100, and a second plurality of minimum pitch equally spaced lines 204 aligned perpendicular to the off-axis component. A first minimum line/space pitch length 206 of the first plurality of equally spaced parallel lines 202 is significantly smaller, for example by a factor of three, than a second minimum line/space pitch length 208 of the second plurality of equally spaced parallel lines 204, due to the significant off-axis component. For example, the illumination source may provide 193 nanometer radiation, and the illumination source off-axis component may be configured so that the first minimum line/space pitch length 206 is 80 to 90 nanometers and the second minimum line/space pitch length 208 is 240 nanometers.

Figure 3A:
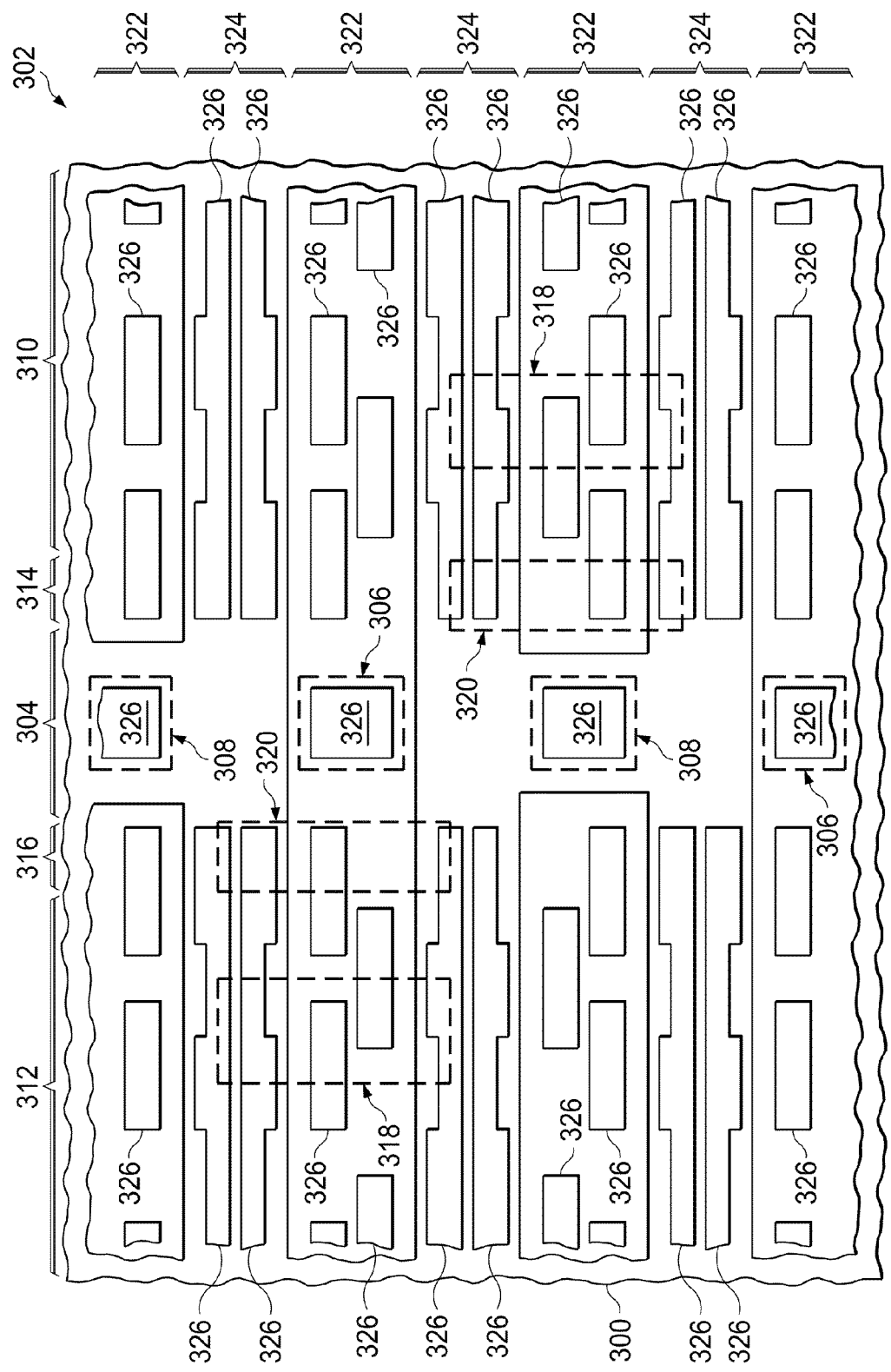
FIG. 3A through FIG. 3I are top views of an exemplary integrated circuit containing an SRAM, depicted in successive stages of fabrication.

FIG. 3A through FIG. 3I are top views of an exemplary integrated circuit containing an SRAM, depicted in successive stages of fabrication. Referring to FIG. 3A, the integrated circuit 300 includes the SRAM 302 and may include other circuits, such as adders, multipliers, shift registers, encoders, decoders and/or standard logic cells. The SRAM 302 includes at least one strap row 304 which contains one or more well ties 306 and/or one or more substrate taps 308. A first SRAM cell region 310 is located adjacent to the strap row 304. The SRAM 302 may contain an optional first half-cell row 314 located between the strap row 304 and the first SRAM cell region 310. A second SRAM cell region 312 is located adjacent to the strap row 304 opposite from the first SRAM cell region 310. The SRAM 302 may contain an optional second half-cell row 316 located between the strap row 304 and the second SRAM cell region 312. Boundaries of SRAM cells 318 in the first SRAM cell region 310 and the second SRAM cell region 312 are depicted in FIG. 3A with phantom lines; the SRAM cells 318 may fill the first SRAM cell region 310 and the second SRAM cell region 312 in a rectangular configuration, sometimes referred to as a manhattan configuration. Similarly, boundaries of half-cells 320 in the first half-cell row 314 and the second half-cell row 316 are depicted in FIG. 3A with phantom lines.

The SRAM 302 includes well regions 322. The well regions 322 have an opposite conductivity type from the substrate regions 324. The substrate regions 324 may have the same conductivity type as a substrate of the integrated circuit 300 and be electrically connected to adjacent substrate regions 324 through the substrate. For example, the integrated circuit 300 may be formed on a p-type substrate, the substrate regions 324 may be p-type and contact the substrate, and the well regions 322 may be n-type. The strap row 304 overlaps one or more portions of the well regions 322 and/or overlaps one or more portions of the substrate regions 324. Other configurations of the well regions 322 and the substrate regions 324 in the strap row 304 are within the scope of the instant example.

The SRAM 302 further includes active areas 326 in the SRAM cells 318, in the half-cells 320 if present, and in the well ties 306 and the substrate taps 308. The active areas 326 in the SRAM cells 318 in the well regions 322 and the substrate regions 324 have opposite conductivity types from the well regions 322 and the substrate regions 324, respectively. The active areas 326 in the well ties 306 have the same conductivity types as the well regions 322, and the active areas 326 in the substrate taps 308 have the same conductivity types as the substrate taps 308.

Figure 3B:
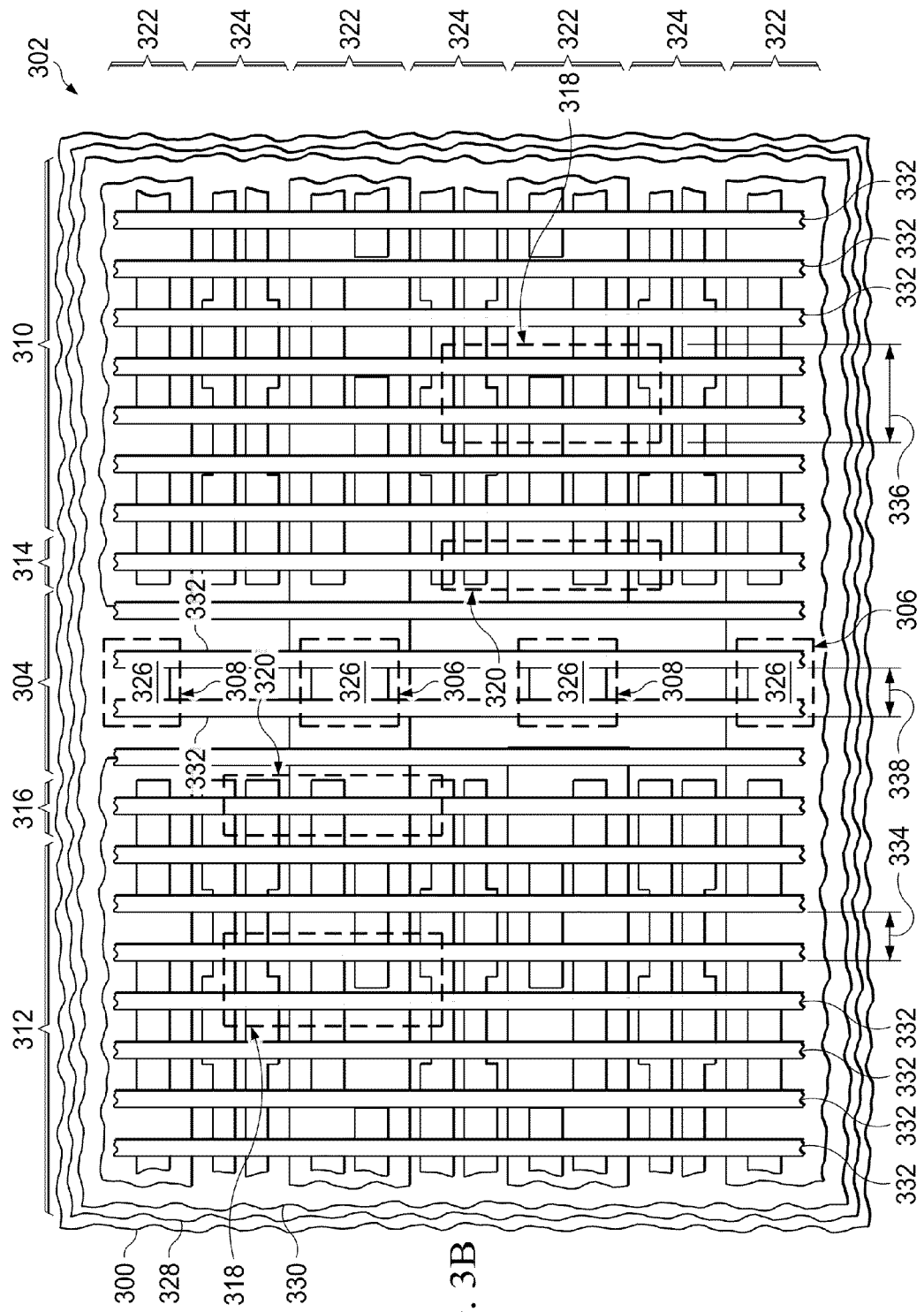

Referring to FIG. 3B, a layer of gate material 328, which includes electrically conductive material, is formed over an existing top surface of the integrated circuit 300. The layer of gate material 328 may include, for example, polycrystalline silicon, commonly referred to a polysilicon, or amorphous silicon, or one or more layers of metal such as titanium nitride. A layer of gate hard mask material 330 is formed over the layer of gate material 328. The layer of gate hard mask material 330 may include, for example, amorphous carbon, antireflection layers, and/or dielectric material such as silicon dioxide, silicon nitride, or silicon oxynitride.

A first gate pattern 332 having a periodic pattern of alternating lines and spaces is formed over the layer of gate hard mask material 330. The first gate pattern 332 may include photoresist and possibly other organic layers such as antireflection layers. The first gate pattern 332 may be formed using an illumination source having a significant off-axis component as described in reference to FIG. 1. A pitch length 334 of the first gate pattern 332 in the SRAM cells 318 is half a width 336 of the SRAM cell 318. The periodic pattern of alternating lines and spaces of the first gate pattern 332 is continuous across the strap row 304, and across the first half-cell row 314 and the second half-cell row 316 if present. Configuring the SRAM 302 so that the first gate pattern 332 is formed with the continuous periodic pattern across the strap row 304 may increase a process latitude of the photolithographic process used to form the first gate pattern 332 and thereby advantageously decrease a fabrication cost of the integrated circuit 300. A width of the strap row 304 is selected so that a pitch length 338 of the first gate pattern 332 in the strap row 304 is within 10 percent of the pitch length 334 of the first gate pattern 332 in the SRAM cells 318. In one version of the instant example, the pitch length 338 of the first gate pattern 332 in the strap row 304 is substantially equal to the pitch length 334 of the first gate pattern 332 in the SRAM cells 318.

Figure 3C:
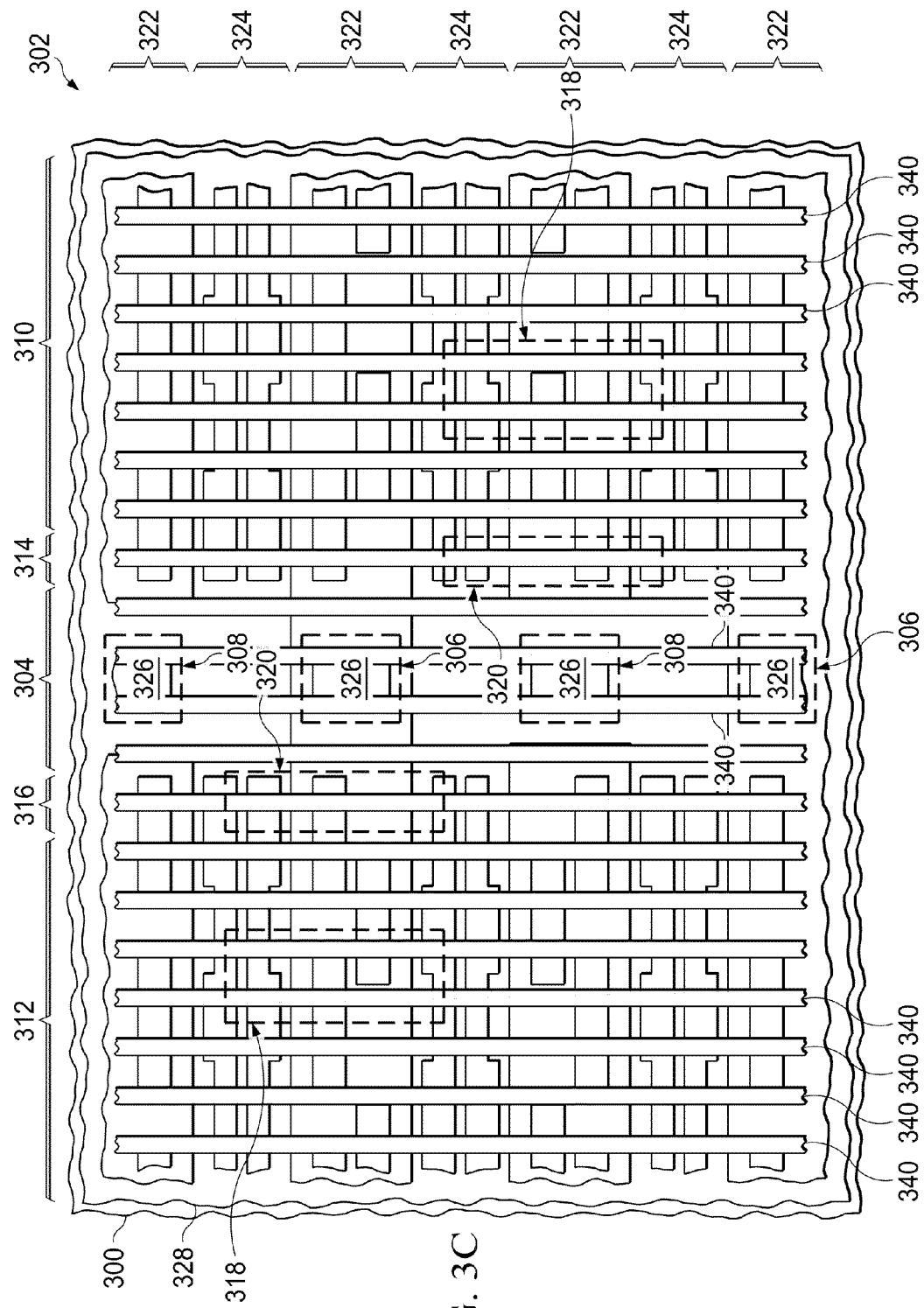

Referring to FIG. 3C, a first gate hard mask etch process removes the layer of gate hard mask material 330 in areas exposed by the first gate pattern 332 to form an etched hard mask 340. The first gate etch process leaves most, and possibly substantially all, of the layer of gate material 328 in place.

Figure 3D:
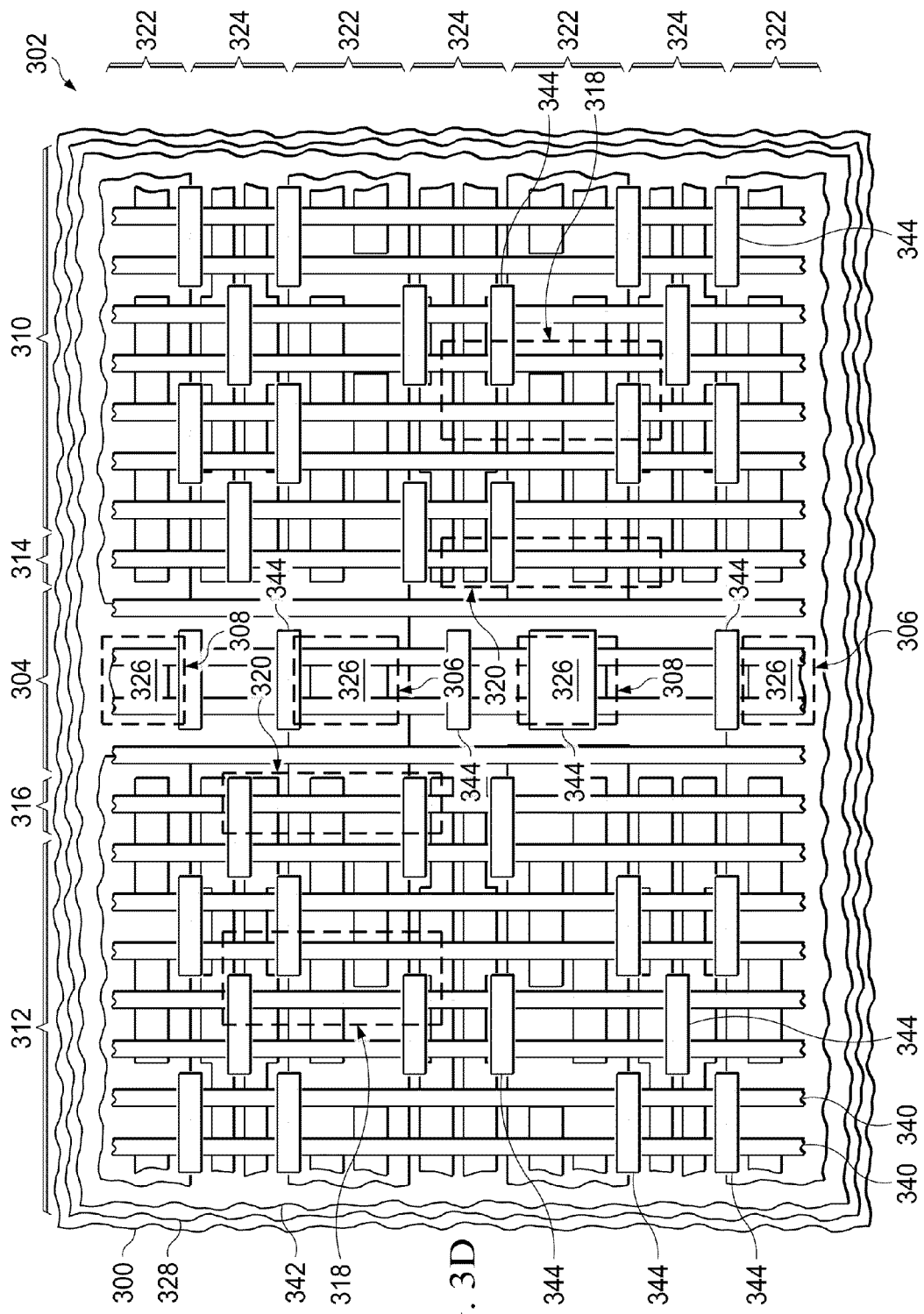

Referring to FIG. 3D, a second gate pattern 342 is formed over the etched hard mask 340 which exposes areas 344. The second gate pattern 342 may include photoresist and possibly other organic layers such as antireflection layers. The exposed areas 344 of the second gate pattern 342 overlap regions of the etched hard mask 340 to be removed prior to etching the layer of gate material 328. The second gate pattern 342 includes exposed areas 344 in the strap row 304, for example to separate segments of gate between instances of the well ties 306 and the substrate taps 308 to prevent short circuits.

Figure 3E:
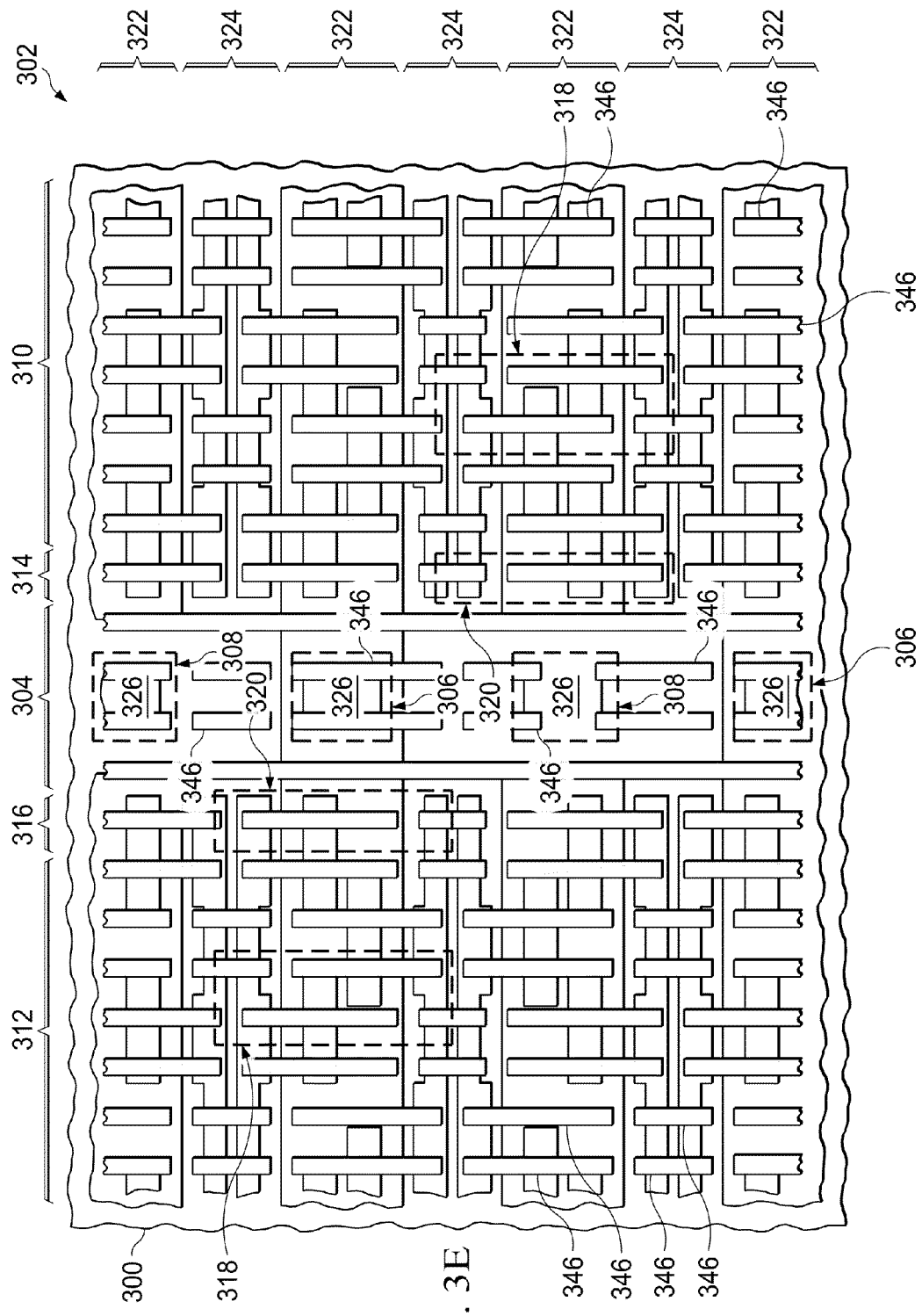

Referring to FIG. 3E, a second gate hard mask etch process removes the layer of gate hard mask material 330 in areas exposed by the second gate pattern 342 to leave the etched hard mask 340 over areas defined for gate structures of the integrated circuit 300. Subsequently, the second gate pattern 342 is removed, for example using an oxygen ash process. After the second gate pattern 342 is removed, a gate etch process removes the layer of gate material 328 is regions exposed by the etched hard mask 340 to form the gate structures 346. Remaining material of the etched hard mask 340 may be removed after the gate etch process is completed. The gate structures 346 may be processed further after the etched hard mask 340 is removed, for example, by replacing the polysilicon with metal gate material. In one version of the instant example, the second gate pattern 342 may be configured so that adjacent instances of active areas 326 in the strap row 304 are not overlapped by a common instance of the gate structures 346, as depicted in FIG. 3E, which may advantageously reduce a potential for undesirable short circuits between the adjacent instances of active areas 326 in the strap row 304.

Figure 3F:
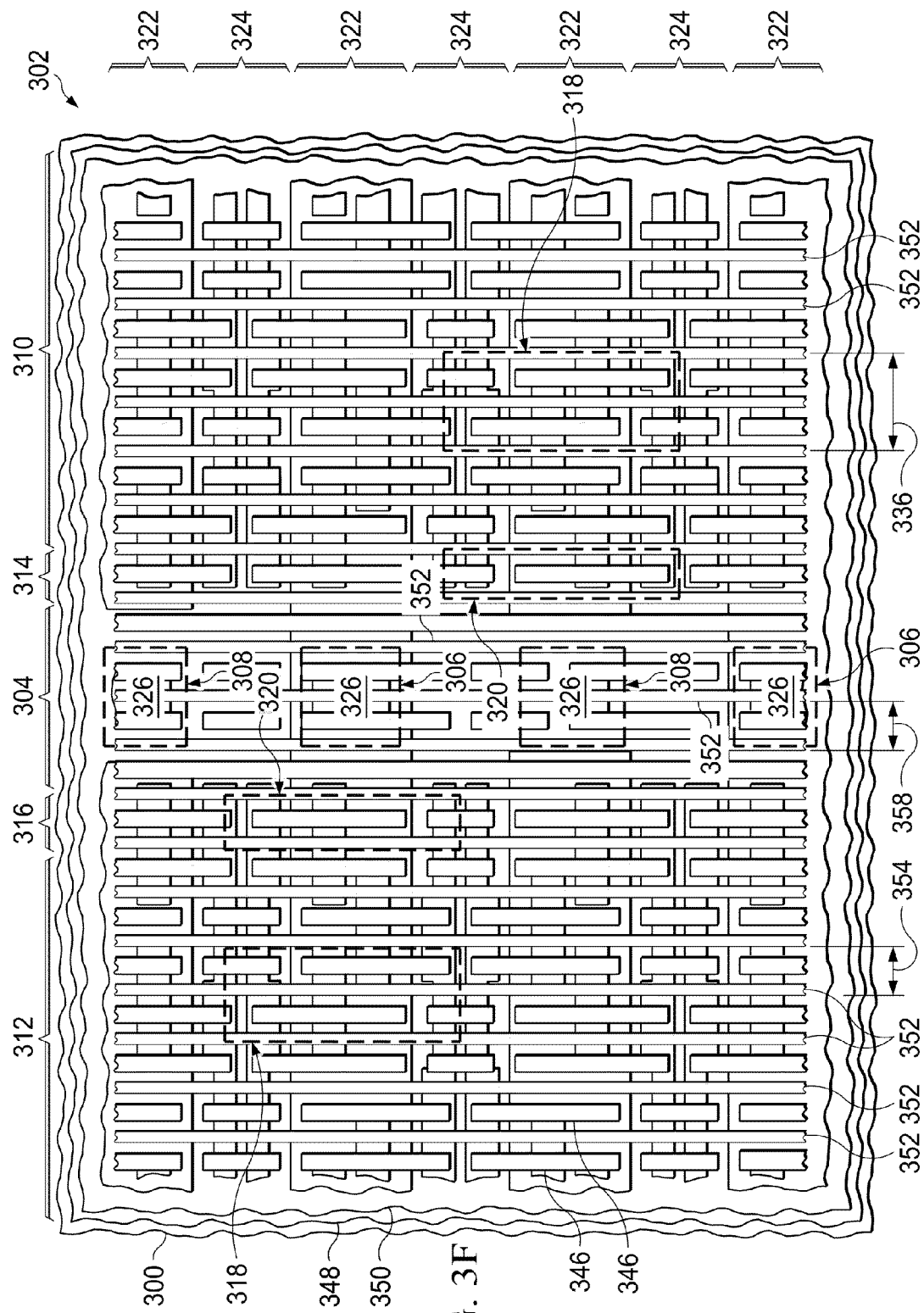

Referring to FIG. 3F, a pre-metal dielectric (PMD) layer stack 348 is formed over an existing top surface of the integrated circuit 300. The PMD layer stack 348 includes a permanent dielectric layer and one or more contact hard mask layers over the permanent dielectric layer. The permanent dielectric layer may include, for example, a liner of silicon nitride, a planarized layer of boron phosphorus silicate glass over the liner, and an etch stop layer over the planarized layer. The contact hard mask layers may include a first contact hard mask layer of amorphous carbon over the permanent dielectric layer and a second contact hard mask layer of silicon nitride over the first contact hard mask layer, which has etch selectivity with respect to the first contact hard mask layer.

A contact trench pattern 350 is formed over the PMD layer stack 348 which exposes the PMD layer stack 348 in trench regions 352. The contact trench pattern 350 may include photoresist and possibly other organic layers such as antireflection layers. The trench regions 352 have a periodic pattern of alternating lines and spaces which is continuous across the strap row 304, and across the first half-cell row 314 and the second half-cell row 316 if present, and may be formed using an illumination source having a significant off-axis component as described in reference to FIG. 1. As with the first gate pattern 332 of FIG. 3B, a pitch length 354 of the contact trench pattern 350 in the SRAM cells 318 is half the width 336 of the SRAM cell 318. A pitch length 358 of the first contact trench pattern 350 in the strap row 304 is within 10 percent of the pitch length 354 of the contact trench pattern 350 in the SRAM cells 318. In one version of the instant example, the pitch length 358 of the contact trench pattern 350 in the strap row 304 is substantially equal to the pitch length 354 of the contact trench pattern 350 in the SRAM cells 318. Configuring the SRAM 302 so that the contact trench pattern 350 is formed with the continuous periodic pattern across the strap row 304 may accrue the same advantage of reduced fabrication cost as described in reference to the first gate pattern 332.

Figure 3G:
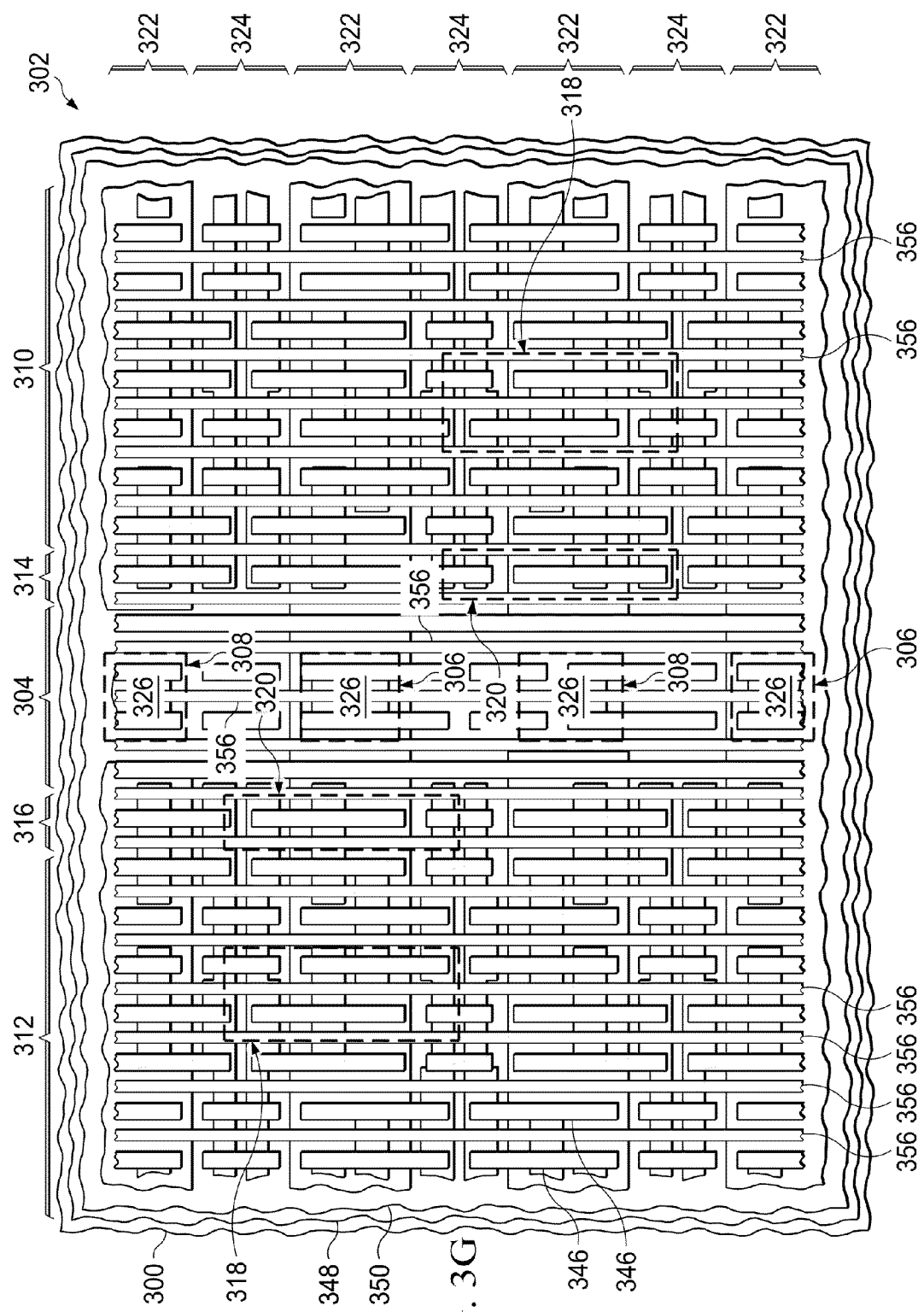

Referring to FIG. 3G, a contact trench etch removes material from the PMD layer stack 348, for example, from the second contact hard mask layer if present, in the trench regions 352 to form contact mask trenches 356. The contact trench pattern 350 may be partially or completely removed during the contact trench etch. Any remaining material of the contact trench pattern 350 may be removed after the contact trench etch is completed.

Figure 3H:
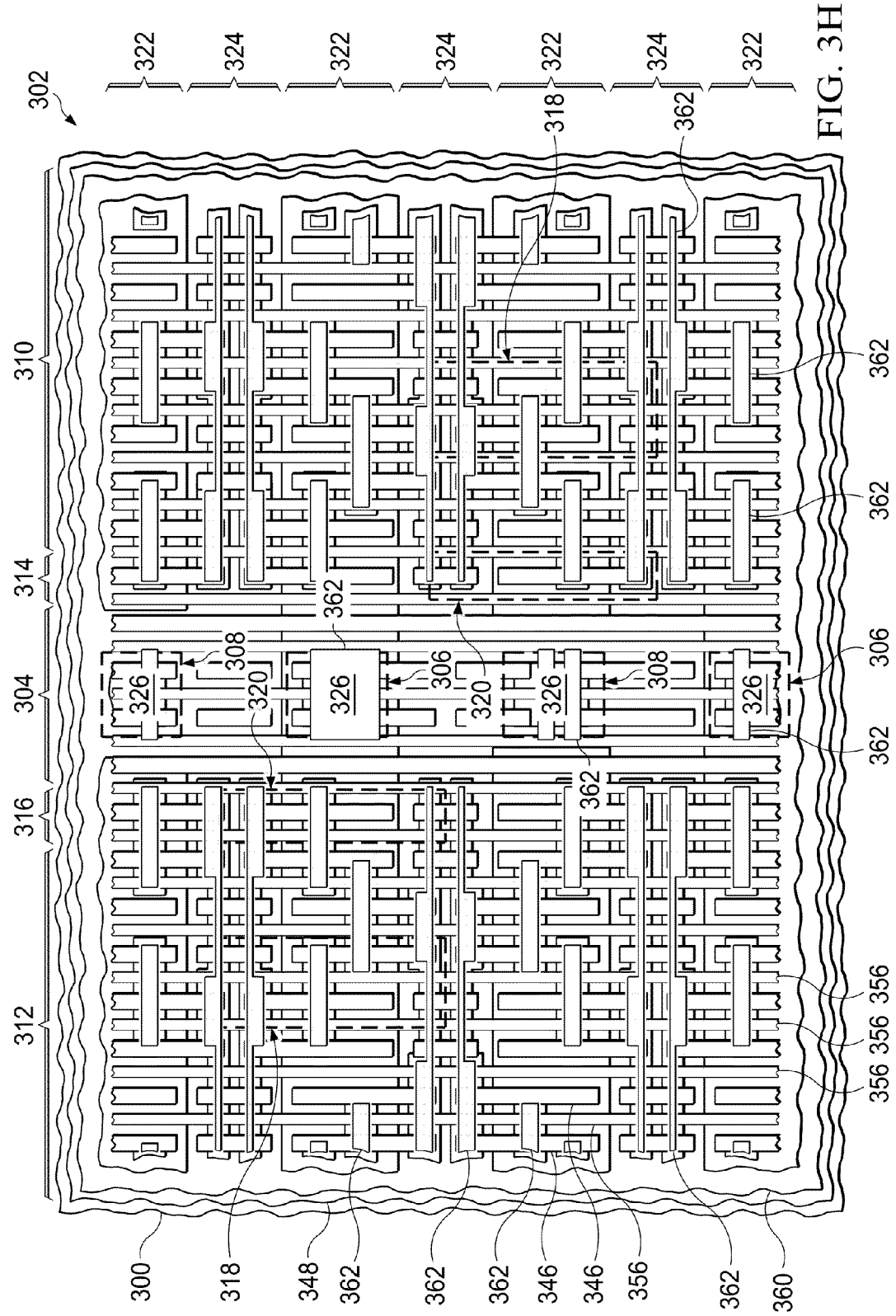

Referring to FIG. 3H, a contact slot pattern 360 is formed over the PMD layer 348 which exposes area 362. The contact slot pattern 360 may include photoresist and possibly other organic layers such as antireflection layers. The exposed areas 362 of the contact slot pattern 360 overlap the contact mask trenches 356 to expose the PMD layer 348 in areas defined for contacts of the integrated circuit 300. The exposed areas 362 of the contact slot pattern 360 in the SRAM cells 318 may be designed using the active areas 326 as templates, as depicted in FIG. 3H. Alternatively, the exposed areas 362 of the contact slot pattern 360 in the SRAM cells 318 may be designed by other methods. The contact slot pattern 360 includes exposed areas 362 in the strap row 304 in order to generate contacts to the well ties 306 and the substrate taps 308.

Figure 3I:
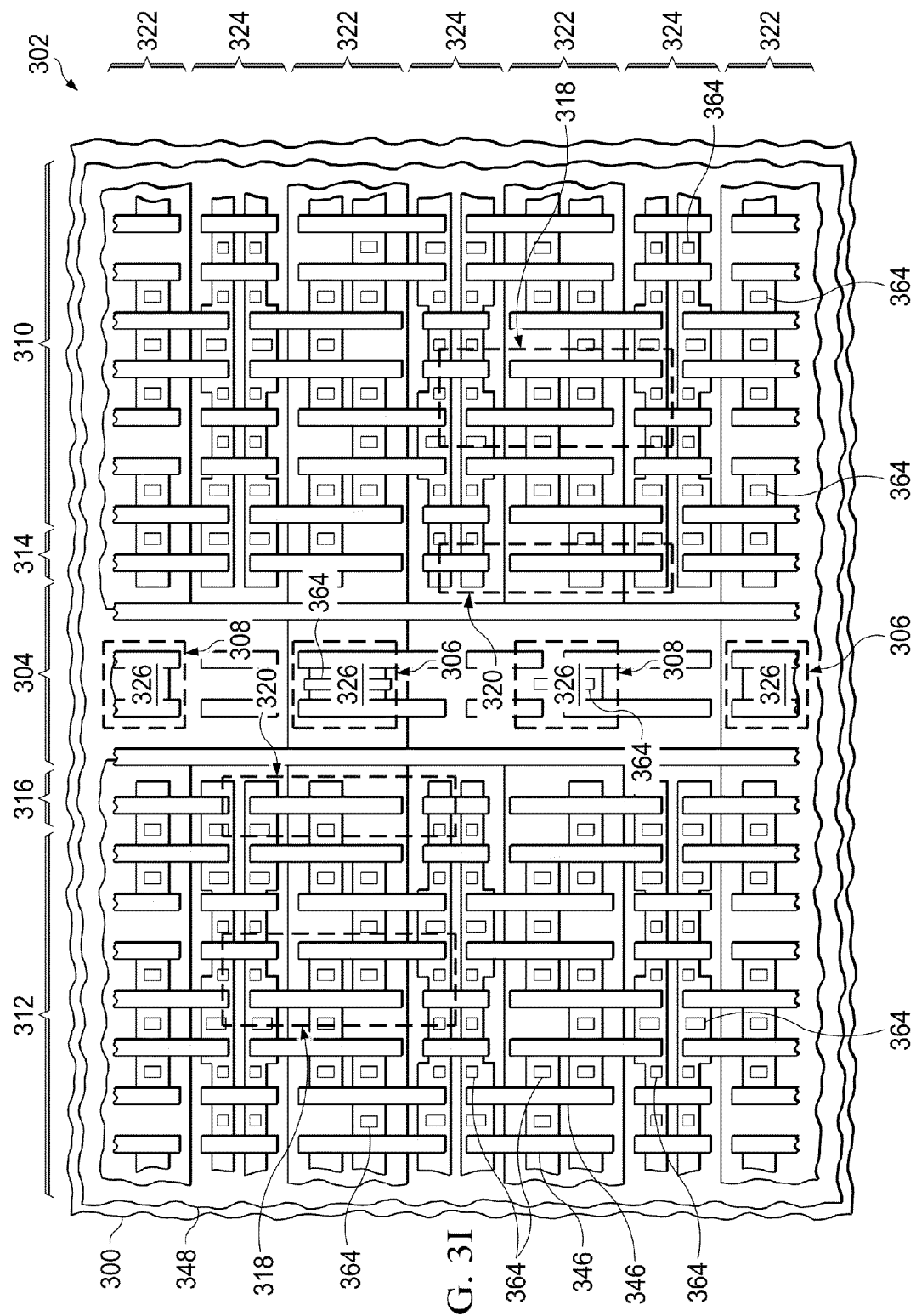

Referring to FIG. 3I, a first etch step of a contact slot etch removes material from the PMD layer 348 where the exposed areas 362 of the contact slot pattern 360 overlap the contact mask trenches 356. For example, the first etch step of the contact slot etch may remove material from the first contact hard mask layer if present. After the first etch step of the contact slot etch is completed, the contact slot pattern 360 is removed, and a second step of the contact slot etch removes material from the PMD layer 348 to form contact holes which expose the active areas 326. After the second step of the contact slot etch is completed, a portion or all of any hard mask material in the PMD layer 348 may be removed.

Subsequently, contact metal is formed in the contact holes to form contacts 364 on the active areas 326. The contact metal may include metal silicide such as nickel silicide, liner metals such as titanium and titanium nitride, and contact fill metal such as tungsten. The strap row 304 includes instances of the contacts 364 on the active areas 326 in the well ties 306 and the substrate taps 308. The contacts 364 in the strap row 304 may be, for example, longer than instances of the contacts 364 in the SRAM cells 318 so as to provide connections with lower electrical resistance to the well regions 322 and/or the substrate regions 324. Alternatively, the contacts 364 in the strap row 304 may be, for example, substantially equal in size to instances of the contacts 364 in the SRAM cells 318 so as to provide a desired level of process latitude in the contact formation process.

Figure 4A:
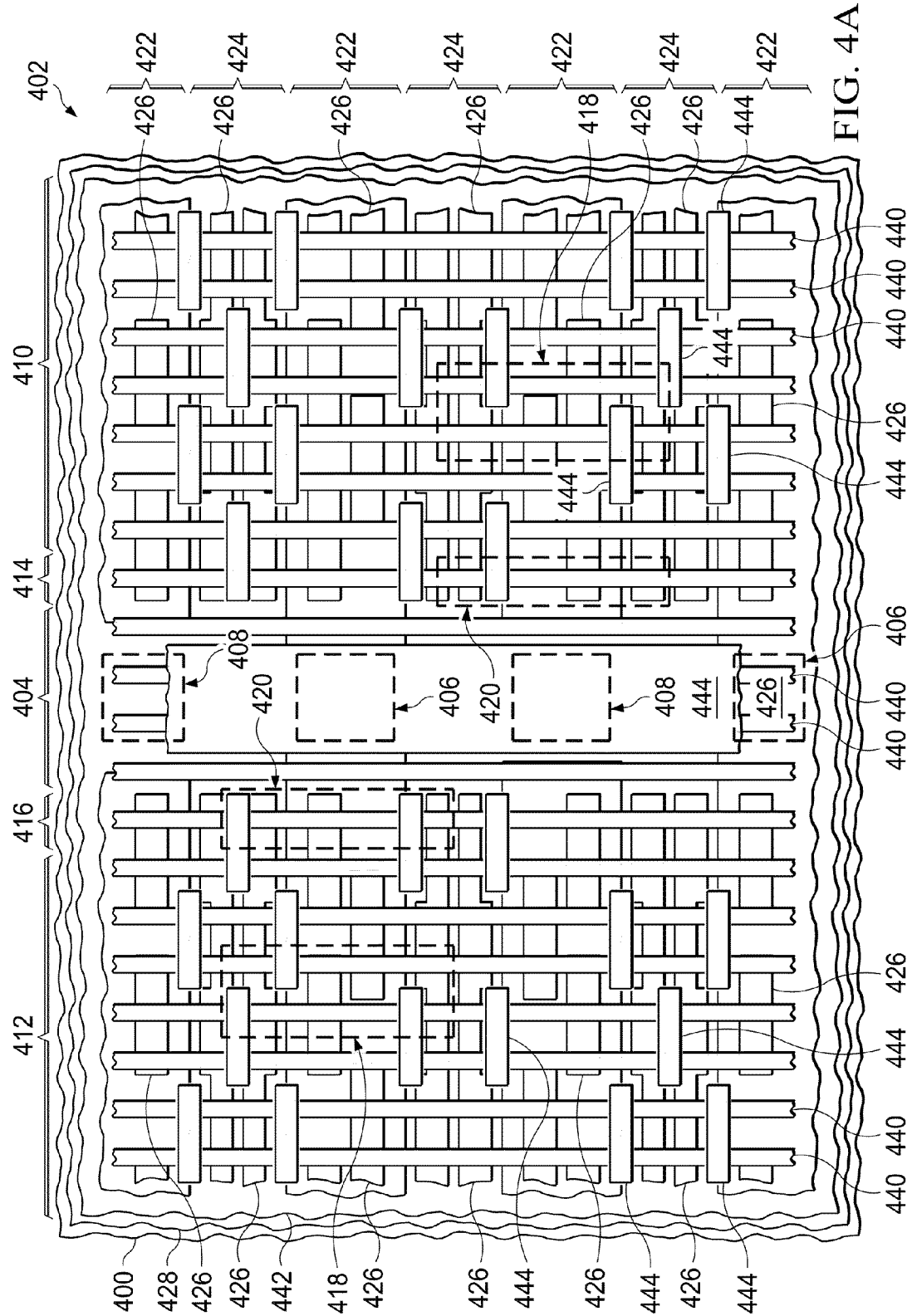
FIG. 4A and FIG. 4B are top views of an integrated circuit similar to that depicted in FIG. 3C, formed according to an alternative example.
Figure 4B:
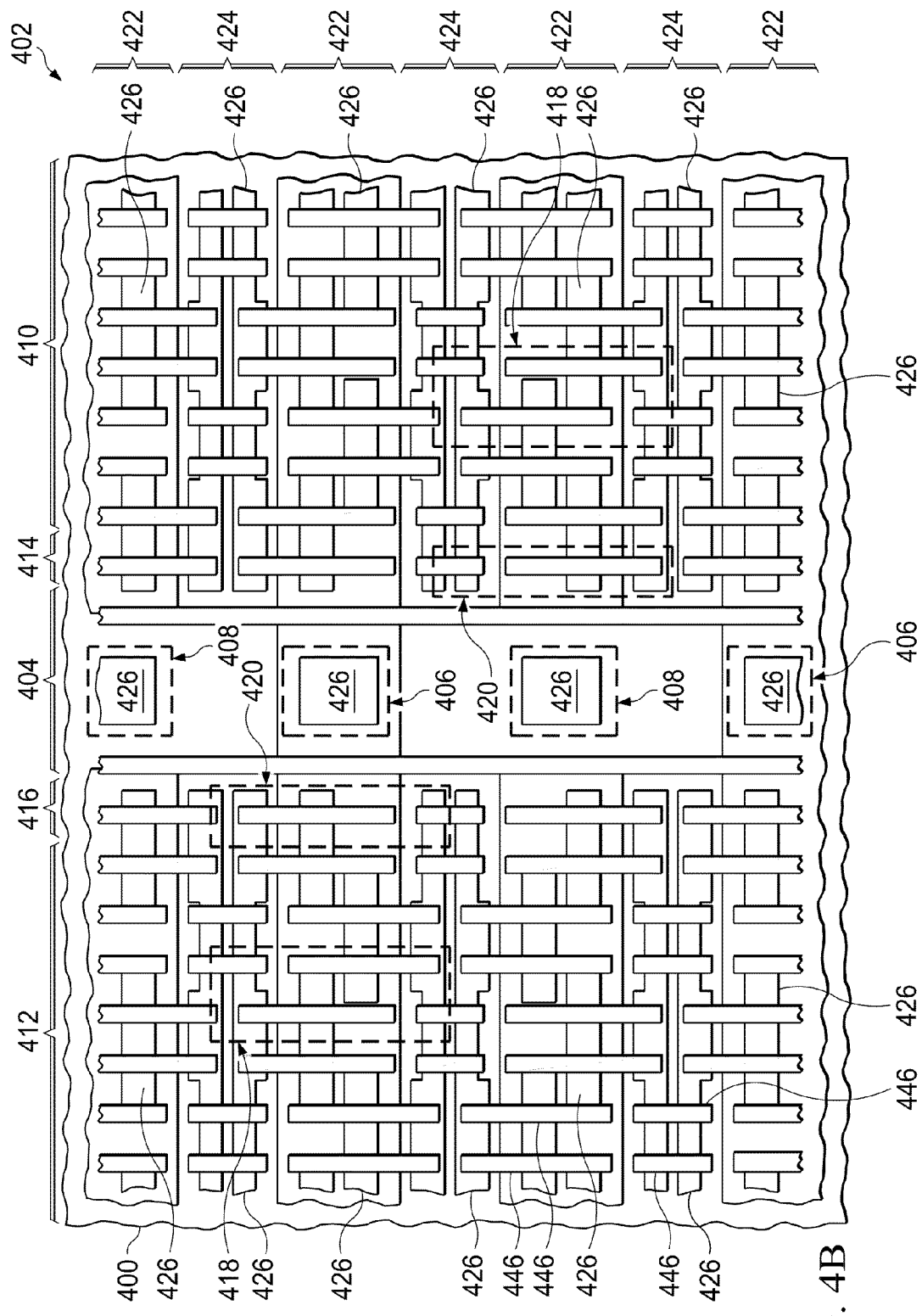

FIG. 4A and FIG. 4B are top views of an integrated circuit similar to that depicted in FIG. 3C, formed according to an alternative example. Referring to FIG. 4A, an integrated circuit 400 includes an SRAM 402 with at least one strap row 404 which contains one or more well ties 406 and/or one or more substrate taps 408, a first SRAM cell region 410 adjacent to the strap row 404, a second SRAM cell region 412 is located adjacent to the strap row 404 opposite from the first SRAM cell region 410, an optional first half-cell row 414 located between the strap row 404 and the first SRAM cell region 410 and an optional second half-cell row 416 located between the strap row 404 and the second SRAM cell region 412. Boundaries of SRAM cells 418 and half-cells 420 are depicted in FIG. 4 with phantom lines. The SRAM 402 includes well regions 422, alternating with substrate regions 424. Active areas 426 are formed in the well regions 422 and the substrate regions 424. An etched hard mask 440 is formed over a layer of gate material 428 as described in reference to FIG. 3B and FIG. 3C.

A second gate pattern 442, is formed over the etched hard mask 440 which exposes areas 444 as described in reference to FIG. 3D. The exposed areas 444 of the second gate pattern 442 overlap regions of the etched hard mask 440 to be removed prior to etching the layer of gate material 428. The second gate pattern 442 includes exposed areas 444 in the strap row 404 which covers regions of the etched hard mask 440 which overlap active areas 426.

Referring to FIG. 4B, a second gate hard mask etch process removes the layer of gate hard mask material 430 in areas exposed by the second gate pattern 442 to leave the etched hard mask 440 over areas defined for gate structures of the integrated circuit 400. Subsequently, the second gate pattern 442 is removed and a gate etch process removes the layer of gate material 428 is regions exposed by the etched hard mask 440 to form the gate structures 446. The active areas 426 in the well ties 406 and the substrate taps 408 are free of overlapping instances of the gate structures 446. The integrated circuit 400 is subsequently processed as described in reference to FIG. 3F through FIG. 3I.

Figure 5:
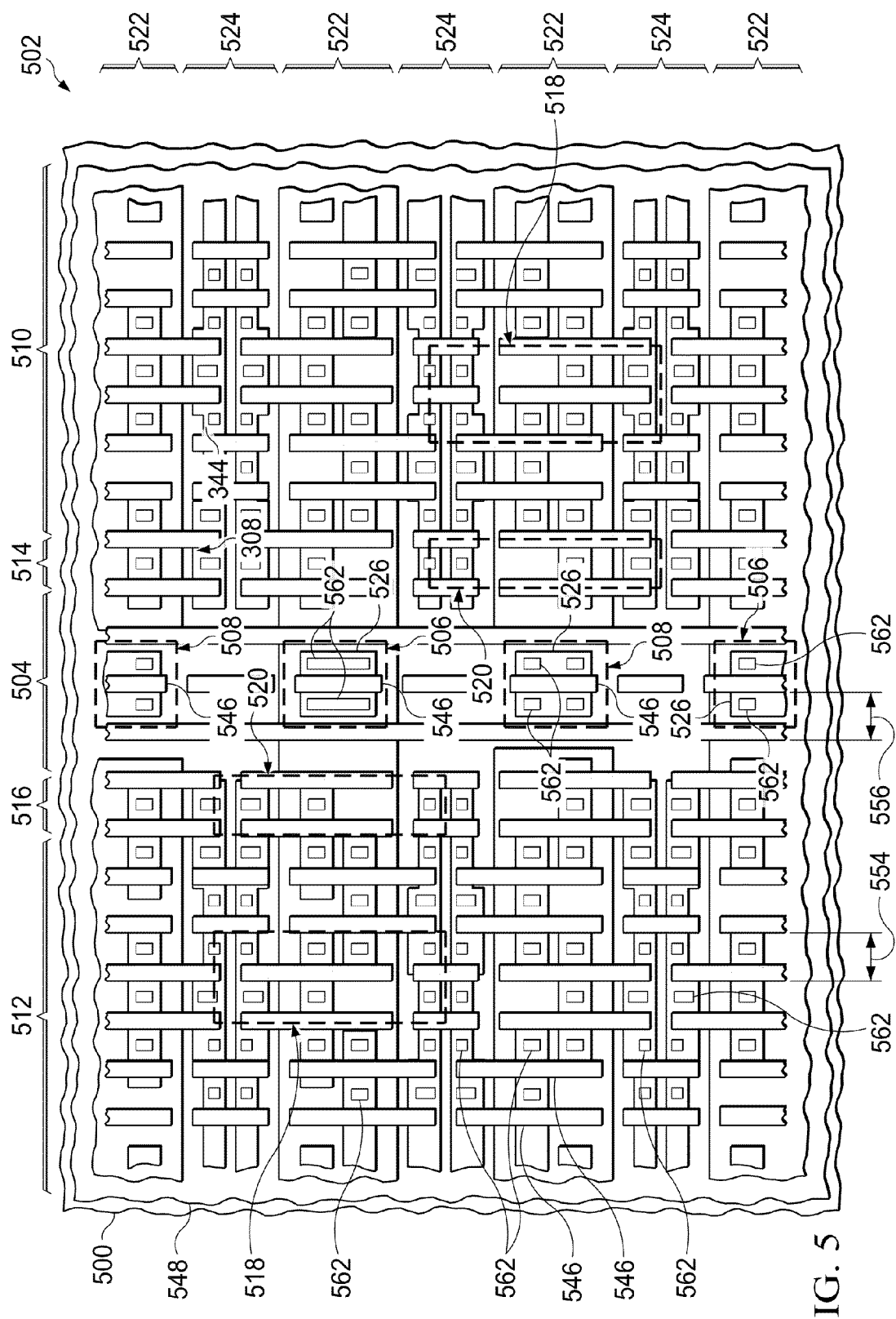
FIG. 5 is a top view of an integrated circuit formed according the process described in reference to FIG. 3A through FIG. 3I, with an alternative layout.

FIG. 5 is a top view of an integrated circuit formed according the process described in reference to FIG. 3A through FIG. 3I, with an alternative layout. The integrated circuit 500 includes an SRAM 502 with a strap row 504 which is more narrow than the strap row 304 of FIG. 3I. A width of the strap row 504 is selected so that a pitch length 556 of gate structures 546 in the strap row 504 is within 10 percent of a pitch length 554 of the gate structures 546 in the SRAM cells 518. In one version of the instant example, the pitch length 556 of gate structures 546 in the strap row 504 is substantially equal to the pitch length 554 of the gate structures 546 in the SRAM cells 518. In the instant example, instances of the gate structures 546 overlap central regions of well ties 506 and/or substrate taps 508 in the strap row 504. Contacts 562 to active areas 526 in the well ties 506 and/or substrate taps 508 are formed on one or both sides of the gate structures 546. Forming the SRAM 502 with a strap row 504 which is more narrow may reduce a size, and hence advantageously reduce a fabrication cost, of the integrated circuit 500.

Figure 6:
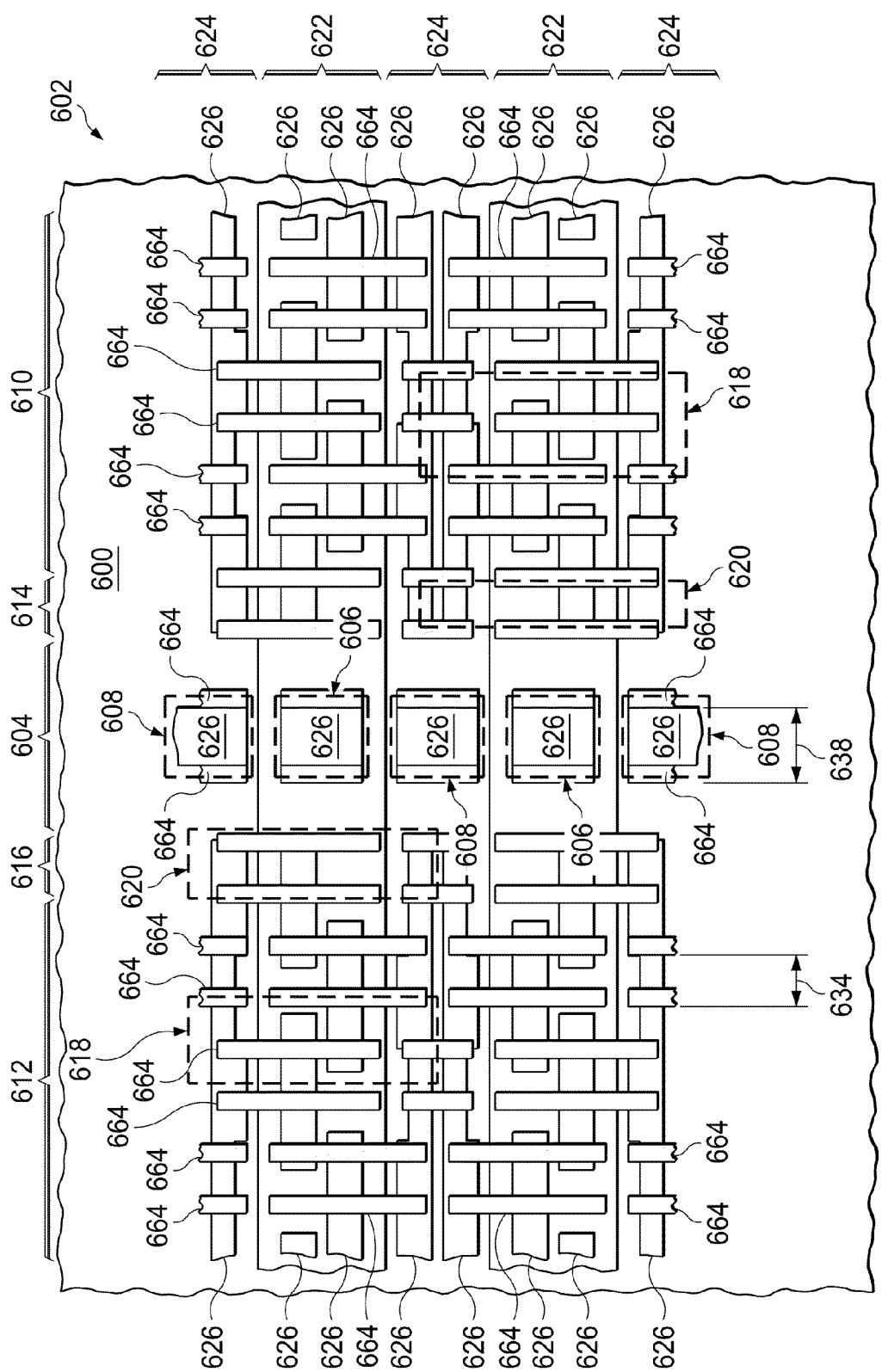
FIG. 6 is a top view of another exemplary integrated circuit containing an SRAM.

FIG. 6 is a top view of another exemplary integrated circuit containing an SRAM. The integrated circuit 600 includes the SRAM 602 and may include other circuits as described in reference to FIG. 3A. The SRAM 602 includes at least one strap row 604 which contains one or more well ties 606 and/or one or more substrate taps 608, a first SRAM cell region 610 adjacent to the strap row 604 and a second SRAM cell region 612 located adjacent to the strap row 604 opposite from the first SRAM cell region 610. The SRAM 602 may contain an optional first half-cell row 614 located between the strap row 604 and the first SRAM cell region 610 and an optional second half-cell row 616 located between the strap row 604 and the second SRAM cell region 612. Boundaries of SRAM cells 618 and half-cells 620 are depicted in FIG. 6 with phantom lines. The SRAM 602 includes well regions 622, alternating with substrate regions 624. Active areas 626 are formed in the well regions 622 and the substrate regions 624.

A periodic photolithographically generated pattern 664 having a periodic pattern of alternating lines and spaces is formed over the integrated circuit 600. The periodic photolithographically generated pattern 664 may be used to form etch-defined circuit elements of the integrated circuit 600 such as gates or contacts, or may be used to define other elements such as implanted regions. The periodic photolithographically generated pattern 664 may be used in conjunction with another photolithographically generated pattern to form the circuit elements, or the circuit elements may be formed using the periodic photolithographically generated pattern 664 without any other photolithographically generated patterns. The periodic photolithographically generated pattern 664 may include photoresist and/or other dielectric materials, such as organic antireflection layers, and/or oxide, nitride or carbon hard mask layers. The periodic photolithographically generated pattern 664 may be formed using an illumination source having a significant off-axis component as described in reference to FIG. 1. The periodic pattern of alternating lines and spaces of the periodic photolithographically generated pattern 664 is continuous across the strap row 604, and across the first half-cell row 614 and the second half-cell row 616 if present. A width of the strap row 604 is selected so that a pitch length 638 of the periodic photolithographically generated pattern 664 in the strap row 604 is within 10 percent of a pitch length 634 of the periodic photolithographically generated pattern 664 in the SRAM cells 618. In one version of the instant example, the pitch length 638 of the periodic photolithographically generated pattern 664 in the strap row 604 is substantially equal to the pitch length 634 of the periodic photolithographically generated pattern 664 in the SRAM cells 618. Configuring the SRAM 602 so that the first gate pattern 632 is formed with the continuous periodic pattern across the strap row 604 may increase a process latitude of the photolithographic process used to form the periodic photolithographically generated pattern 664 and thereby advantageously decrease a fabrication cost of the integrated circuit 600.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a static random access memory (SRAM), comprising:
    a strap row containing at least one of a well tie and a substrate tap;
    a first SRAM cell region adjacent to said strap row;
    a second SRAM cell region adjacent to said strap row opposite from said first SRAM cell region;
    a plurality of circuit elements disposed in said strap row, in said first SRAM cell region and in said second SRAM cell region, said circuit elements being configured in a periodic pattern of alternating lines and spaces, such that a difference between a pitch length of said circuit elements in said strap row and a pitch length of said circuit elements in said first SRAM cell region and in said second SRAM cell region is within 10 percent;
    a first half-cell row located between said strap row and said first SRAM cell region; and
    a second half-cell row located between said strap row and said second SRAM cell region.

2. The integrated circuit of claim 1, in which said circuit elements are formed by etching a layer including electrically conductive material using an etch mask, said etch mask having said periodic pattern of alternating lines and spaces.

3. The integrated circuit of claim 1, in which said circuit elements are formed by etching a layer of dielectric material using an etch mask, said etch mask having said periodic pattern of alternating lines and spaces, and filling a region.

4. The integrated circuit of claim 1, in which said pitch length of said circuit elements in said strap row is substantially equal to said pitch length of said circuit elements in said first SRAM cell region and in said second SRAM cell region.

5. The integrated circuit of claim 1, in which said circuit elements are gate structures.

6. The integrated circuit of claim 1, in which said strap row contains at least one well tie and at least one substrate tap.

7. The integrated circuit of claim 1, in which plurality of circuit elements in the strap row overlap active areas in said strap row.

8. The integrated circuit of claim 7, in which adjacent instances of said active areas in said strap row are not overlapped by a common instance of said plurality of circuit elements.

9. An integrated circuit having a static random access memory (SRAM), the SRAM comprising:
a strap row containing at least one of a well tie and a substrate tap;
a first SRAM cell region adjacent to said strap row;
a second SRAM cell region adjacent to said strap row opposite from said first SRAM cell region; and
a plurality of gate structures disposed in said strap row, in said first SRAM cell region and in said second SRAM cell region, said gate structures being configured in a periodic pattern of alternating lines and spaces, such that a difference between a pitch length of said gate structures in said strap row and a pitch length of said gate structures in said first SRAM cell region and in said second SRAM cell region is within 10 percent, and wherein no adjacent instances of said active areas in said strap row are overlapped by a common instance of said plurality of gate structures.

10. An integrated circuit having a static random access memory (SRAM), the SRAM comprising:
a strap row containing at least one of a well tie and a substrate tap;
a first SRAM cell region adjacent to said strap row;
a second SRAM cell region adjacent to said strap row opposite from said first SRAM cell region;
a plurality of gate structures disposed in said strap row, in said first SRAM cell region and in said second SRAM cell region, said gate structures being configured in a periodic pattern of alternating lines and spaces;
a first half-cell row located between said strap row and said first SRAM cell region; and
a second half-cell row located between said strap row and said second SRAM cell region, wherein the periodic pattern of alternating lines and spaces is continuous across the first half-cell row, the strap row, and the second half-cell row.

* * * * *